United States Patent [19]

Samudrala

[11] 4,331,705
[45] May 25, 1982

[54] CURING OF POLYAMIC ACIDS OR SALTS THEREOF BY ULTRAVIOLET EXPOSURE

[75] Inventor: Rama P. Samudrala, Maplewood, Minn.

[73] Assignee: Minnesota Mining and Manufacturing Company, Saint Paul, Minn.

[21] Appl. No.: 120,710

[22] Filed: Feb. 11, 1980

[51] Int. Cl.³ .............................................. B05D 3/06
[52] U.S. Cl. .................................... 427/54.1; 528/289
[58] Field of Search ........................ 427/54.1; 528/289

[56] References Cited

U.S. PATENT DOCUMENTS

| | | | |
|---|---|---|---|
| 3,596,125 | 7/1971 | Seigel | 313/22 |
| 3,733,709 | 5/1973 | Bassemir et al. | 34/4 |
| 3,840,448 | 10/1974 | Osborn et al. | |
| 4,055,769 | 10/1977 | Sander | 250/492 R |
| 4,101,424 | 7/1978 | Schooley et al. | 250/504 |
| 4,107,174 | 8/1978 | Baumann et al. | 528/289 |
| 4,135,098 | 1/1979 | Troue | 250/492 R |
| 4,217,389 | 8/1980 | Peterson | 528/289 |

FOREIGN PATENT DOCUMENTS

| | | |
|---|---|---|
| 1316976 | 5/1973 | United Kingdom . |
| 1435151 | 5/1976 | United Kingdom . |
| 1463286 | 2/1977 | United Kingdom . |

*Primary Examiner*—John H. Newsome
*Attorney, Agent, or Firm*—Cruzan Alexander; Donald M. Sell; Gerald F. Chernivec

[57] ABSTRACT

A process for curing a film of polyamic acid or a salt thereof to the corresponding polyimide comprising exposing the film to ultraviolet radiation for a sufficient time and at a sufficient intensity to cure same. The film can be selectively exposed in an imagewise fashion through an appropriate mask followed by developing to remove unexposed areas.

7 Claims, No Drawings

CURING OF POLYAMIC ACIDS OR SALTS THEREOF BY ULTRAVIOLET EXPOSURE

BACKGROUND OF THE INVENTION

This invention relates to the curing of films of polyamic acid or salts thereof to form polyimides. More specifically, the invention relates to the use of ultraviolet radiation to cure films of polyamic acid or salts thereof.

Polyimides are typically prepared by a condensation polymerization reaction between organic diamines and tetracarboxylic acid dianhydrides, and demonstrate excellent high temperature and dielectric properties. Because of the properties of polyimides, they have found broad utility in many areas.

Present commercial practice is to purchase polyimide films themselves or polyamic acid, the precursor of polyimides, in a liquid, and thus castable, form. The polyamic acid, once cast and the solvent removed, can be cured or imidized at elevated temperatures to the polyimide form. This curing temperature is in the range of 650° F.

The problem with this practice is, of course, that the number of substrates available for application of a curable polyamic acid or salt thereof thereto becomes somewhat limited, i.e. they must be in essence temperature-resistant. Yet, in many instances, it would be desirable to use substrates in conjunction with a polyimide which would not be heat stable at the normal elevated curing temperatures for formation of the polyimide. Such applicability has not heretofore been available.

It has now been ascertained that ultraviolet radiation can contribute to the curing of films of polyamic acid or salts thereof to a polyimide. The condensation polymerization reaction involved in the curing process can therefore be undertaken at a much lower temperature than was normally thought necessary. This allows use of substrates, in conjunction with polyimides, which are not normally stable to excessive temperatures.

Furthermore, by use of the ultraviolet curing, films of polyamic acids or their salts attain the status of being photodefinable, i.e. a mask can be selectively utilized to cure selected areas of the polyamic acid or salt film in an imagewise fashion, thereby allowing removal of the unexposed portions, again in an imagewise fashion.

SUMMARY OF THE INVENTION

In accordance with the invention, there is provided a process for curing a film of polyamic acid or salt thereof to the corresponding polyimide, comprising exposing at least one surface of said film to ultraviolet radiation for a sufficient time and at sufficient intensity to cure said film.

Because high temperatures are not necessary for curing, a variety of substrates which are not heat stable can be utilized with the resultant polyimide.

Selective curing in an imagewise fashion through an appropriate original, followed by development, provides a photodefined polyimide image.

DETAILED DESCRIPTION OF THE INVENTION

Polyimides are prepared by reacting at least one organic diamine having the structural formula:

wherein $R_1$ is a divalent radical containing at least two carbon atoms, the two amino groups being each attached to separate carbon atoms of the divalent radical, with at least one tetracarboxylic acid dianhydride having the structural formula:

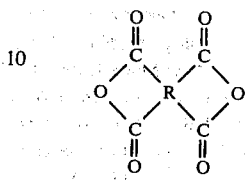

wherein R is a tetravalent radical containing at least two carbon atoms, with no more than two carbonyl groups of the dianhydride attached to any one carbon atom of the tetravalent radical. The reaction initially forms a polyamic acid, which when cured or further reacted in the past at elevated temperatures, forms the corresponding polyimide.

The preparation of polyamic acids is disclosed in a number of United States patents, including U.S. Pat. Nos. 3,179,614; 3,179,630; 3,179,631; and 3,073,784.

The polyamic acid can be simply formed in solvents such as N-methylpyrrolidone, dimethyl acetamide, or dimethyl formamide to provide a coating or application solution. Polyamic acid concentrations of from about 1 to about 30 percent by weight are satisfactory, increased solution viscosity and resultant application problems providing in reality the only limit as to solution concentration. From about 15 to about 20 percent by weight appears to be optimum for coating applications and is therefore preferred.

Furthermore, I have found that conversion of the polyamic acid to a salt prior to curing can provide a product with the same functionality relative to ultraviolet radiation curing, and in fact can provide additional benefit. When a corresponding salt is utilized, greater latitude in exposure and development is observed. Exposure time necessary to form a cured image is reduced and increased image resolution is noted, with the unexposed areas being removed more easily and with no residue thereof.

A polyamic acid can be converted to a salt by simply mixing same in a solvent with a base, preferably utilizing an equivalent concentration thereof. When the resultant cured polyimide is to be used in an electrical application, as a dielectric layer, for example, it is preferred that volatile non-metallic bases are used to obtain the salt.

Dry film thickness of the polyamic acid or salt is limited only by the practical considerations relative to ultraviolet exposure, with about 5 mils being the maximum. Exposure to ultraviolet radiation can, of course, be undertaken to both sides of the film simultaneously, thereby maximizing ultraviolet penetration and curing of the polyamic acid or salt to the polyimide.

Radiation intensity to effect curing can vary, with lesser intensities requiring longer exposure times. The polyamic acid or salt should be subjected to radiation for a sufficient time, at a sufficient intensity, to cure the acid or salt to the polyimide form.

My invention will now be described in more detail by the use of the following non-limiting examples, wherein all parts are by weight unless otherwise specified.

The ultraviolet light source utilized in the examples, unless otherwise noted, was an ASHDEE UV 12/1, which is manufactured by the Ashdee Division of George Koch and Sons, Inc. The unit has a single twelve inch long, 200 watt per inch medium pressure mercury lamp with an arc length of twelve inches.

During exposure of the samples to ultraviolet radiation, the samples were clipped to an aluminum plate to hold same firm during exposure, then placed on the conveyor belt of the exposure unit at the entry thereof, the aluminum plate then being picked up at the exit of the exposure unit. Each such travel through the unit is therefor referred to herein as one pass. To increase the quantity of radiation, the samples were sent through the unit in several passes. When such was undertaken, to aid uniform exposure across the surface, samples were transmitted through the source lengthwise for one pass and at right angles thereto for a consecutive pass. In all instances, the conveyor speed was six feet per minute and the time of exposure per each pass under the exposure unit approximated one second exposure to the most intense light. This exposure, i.e., a single pass through the unit at the noted speed is equivalent to a density of 0.22 watt-seconds per square centimeter as measured using an Ashdee Ultraviolet Power Density Meter measuring the 3650 angstrom wavelength.

EXAMPLE 1

A commercially available polyamic acid, Pyre ML, from DuPont, was utilized in this example. This acid is the reaction product of oxydianiline and pyromellitic dianhydride and is in solution suitable for coating applications as purchased.

The material was cast onto one ounce copper foil with a knife coater to provide a 6 mil wet thickness, followed by air drying at 275° F. to evaporate the solvent from the film.

The material was placed in the exposure unit, whereupon the degree of curing or imidization thereof with increasing amounts of radiation was monitored utilizing infrared spectroscopy. Samples of uncured film were exposed to ultraviolet radiation from one side as noted in Table I below.

The copper foil was then etched away utilizing conventional ferric chloride solution and the polyamic acid film was cleaned in deionized water.

The spectra of the uncured film illustrates a predominating absorption band at the 3.1 micron wavelength due to the NH bond. As the imidization progresses, the bonds at the 3.1 micron wavelength disappear and the characteristics imide bonds at the 5.6 and 13.8 micron wavelengths appear with high absorbence. This progressive feature, as observed on samples exposed to increasing numbers of passes of ultraviolet radiation is illustrated in Table I.

TABLE I

| | Infrared Spectrum Analysis (Values Expressed in Percent) | | | | | |
|---|---|---|---|---|---|---|
| | 3.1 μ Peak | | 5.6 μ Peak | | 13.8 μ Peak | |
| UV Exposure | Transmission | Absorbance | Transmission | Absorbance | Transmission | Absorbance |
| Uncured | 12 | 88 | 32 | 68 | 24 | 76 |
| 1 Pass | 11 | 89 | 26 | 74 | 23 | 77 |
| 2 Pass | 16 | 84 | 19 | 81 | 21 | 79 |
| 3 Pass | 69 | 31 | 19 | 81 | 16 | 84 |
| 4 Pass | 63 | 37 | 10 | 90 | 16 | 84 |
| 5 Pass | 68 | 32 | 9 | 91 | 17 | 83 |
| 6 Pass | 70 | 30 | 10 | 90 | 16.5 | 83.5 |
| 7 Pass | 72 | 28 | 9 | 91 | 16 | 84 |
| 8 Pass | 73 | 27 | 10 | 90 | 18 | 82 |
| 10 Pass | 76 | 24 | 10 | 90 | 17 | 83 |
| Heat Cure | 84 | 16 | 8.5 | 91.5 | 20.5 | 79.5 |

EXAMPLE 2

To investigate the effect of curing a polyamic acid film by exposure through both sides of the film to ultraviolet radiation, as would be the case for an unsupported film, a sample of polyamic acid film prepared as per Example 1 on a copper foil and dried at 300° F. was exposed to ultraviolet light. The copper backing of the film was then etched away and the film exposed to ultraviolet light from the opposite side, i.e., that which was adjacent the copper. The infrared spectra of the samples exposed to both sides indicate more rapid curing or imidization than exposure from only one side. The samples essentially attained cure completion in two passes through the exposure unit, as indicated in Table II below.

TABLE II

| | Infrared Spectrum Analysis (Values Expressed in Percent) | | | | | |
|---|---|---|---|---|---|---|
| | 3.1 μ Peak | | 5.6 μ Peak | | 13.8 μ Peak | |
| UV Exposure | Transmission | Absorbance | Transmission | Absorbance | Transmission | Absorbance |
| Uncured | 26 | 74 | 20 | 80 | 27 | 73 |
| 1 Pass | 92 | 8 | 6 | 94 | 18 | 82 |
| 2 Pass | 93 | 7 | 6 | 94 | 17 | 83 |
| 4 Pass | 93 | 7 | 6 | 94 | 16 | 84 |

EXAMPLE 3

Polyamic acid films readily dissolve in caustic solution at room temperature, but once cured, caustic displays no significant attack thereon.

A caustic solution was therefore prepared by dissolving analytical grade sodium hydroxide in water in the proportion of five grams of solid sodium hydroxide in 95 ml water, following which the solution was mixed and allowed to attain room temperature. With the solution placed in a beaker with a magnetic stirrer, samples of polyamic acid film were suspended therein such that the stirrer provided moderate agitation.

With samples prepared as per Example 1, a film having no exposure to ultraviolet radiation completely dissolved in the caustic solution in one minute. After a single pass through the exposure unit, some areas of the sample were attacked after two minutes, which indicates uneven exposure over the surface area of the film. After two passes, a partial attack was noted after five minutes duration in the caustic solution, and the same results were noted after three passes through the exposure unit. At four passes through the unit, there was no apparent attack on the imidized film after six minutes of immersion in the caustic solution.

EXAMPLE 4

Example 1 was duplicated with the exception that base materials other than copper foil were utilized as coating substrates. In all instances, the degree of imidization or curing was checked utilizing the caustic solubility test described in the preceding Example. The following backing materials were utilized: paper, polyester film, aluminum, stainless steel, epoxy-fiberglas circuitboard material, solder, and silicon wafer. In all instances, the polyamic acid was cured on these various substrates.

EXAMPLE 5

To assess the curability of other polyamic acids by exposure to ultraviolet radiation, various polyamic acids were prepared using combinations of dianhydrides and diamines.

In each instance, the diamine was dissolved in N-methylpyrrolidone in a wide mouth bottle. The dianhydride was placed in a small polyethylene boat and floated on the diamine solution. The bottle was capped with polyethylene film and suddenly shaken vigorously to rapidly mix the dianhydride. Generally, a mild exotherm was noted as well as an increase in solution viscosity. The mixture was placed on a shaker for further mixing. Generally reaction was complete in about 30 minutes, and the solutions contained about 16 percent by weight of the polyamic acid.

In this manner, samples were prepared utilizing benzophenone tetracarboxylic dianhydride together with hexane diamine, methylene dianiline, m-phenylene diamine, oxydianiline and methylene bis-cyclohexylamine. Additionally, pyromellitic dianhydride was used in conjunction with methylene dianiline, m-phenylene diamine, and methylene bis-cyclohexylamine to prepare the corresponding polyamic acids.

These acids were then cast on copper foil and dried in an oven at 275° F., followed by curing same by exposure under the ultraviolet light source of Example 1. The progress of the curing cycle after exposure to ultraviolet radiation was monitored by the decrease of the 3.1 micrometer absorbance peak on the infrared spectrum or by caustic solubility test described earlier.

All of the samples prepared as above exhibited curing upon exposure to ultraviolet radiation.

EXAMPLE 6

A polyamic acid was prepared as per Example 5 utilizing benzophenone tetracarboxylic dianhydride and hexane diamine. The polyamic acid resulting therefrom was cast on copper foil and dried in an oven at 270' F. for fifteen minutes to remove solvent therefrom. The thickness of the dried film on the copper foil was determined to be from 0.1 to 0.2 mils.

The sample was then exposed to ultraviolet radiation utilizing an original having patterns thereon and various resolution targets. A quartz glass was placed upon the original to hold same in a flat position. It was determined that exposure to the ultraviolet source of Example 1 for 75 seconds was satisfactory to provide photodefinability to the film. The thus exposed sample exhibited a visible image of the exposure pattern. The exposed area became dark yellow, the typical color of cured polyimide, whereas the unexposed areas remained unchanged. The sample was then developed with n-methylpyrrolidone and water rinsed, whereby the unexposed areas were removed, followed by drying in the air. The developed image provided excellent resolution.

Preferred polyamic acids include those utilizing the benzophenone tetracarboxylic dianhydride with hexane diamine, oxydianiline, and methylene bis-cyclohexylamine, and that of Example 1. The benzophenone tetracarboxylic dianhydride/hexane diamine combination is most preferred since it exhibits the best characteristics relative to photodefinability.

EXAMPLE 7

A polyamic acid was prepared as per Example 6, the resulting mixture containing a 20 percent solids polyamic acid. To 20 grams of the acid were added 1.84 grams of triethylamine, whereupon the acid was converted to a salt.

The salt solution was coated onto aluminum foil and dried in an oven at 130° C. for 15 minutes to remove the solvent. The dried film was exposed through a quartz glass photomask to ultraviolet radiation for one minute using a COLITE Model DMVLS exposure unit.

The imagewise exposed film was developed using N-methyl pyrrolidone, whereupon the unexposed areas of the film were removed. The resulting sample was rinsed with toluene and dried to remove the solvent. A polyimide image area having excellent resolution was produced.

What is claimed is:

1. A process for curing a film of a polyamic acid or salt thereof to a corresponding polyimide comprising exposing at least one surface of said film to ultraviolet radiation at a sufficient intensity for a sufficient time to cure said film.

2. The process of claim 1, wherein said polyamic acid is selected from the group consisting of benzophenone tetracarboxylic dianhydride/hexane diamine, benzophenone tetracarboxylic dianhydride/oxydianiline, benzophenone tetracarboxylic dianhydride/methylene bis-cyclohexylamine, and pyromellitic dianhydride/oxydianiline.

3. A process for curing a film of a polyamic acid or salt thereof on a substrate to a corresponding polyimide comprising exposing the surface of said film to ultraviolet radiation at a sufficient intensity for a sufficient time to cure said film.

4. The process of claim 3, wherein said polyamic acid film is selected from the group consisting of benzophenone tetracarboxylic dianhydride/hexane diamine, benzophenone tetracarboxylic dianhydride/oxydianiline, benzophenone tetracarboxylic dianhydride/methylene bis-cyclohexylamine, and pyromellitic dianhydride/oxydianiline.

5. A process for forming an imaged construction comprising a polyimide image on a substrate coated with a polyamic acid or salt thereof comprising the steps of:
   (a) exposing said polyamic acid or salt thereof to ultraviolet radiation in an imagewise fashion for a sufficient time at a sufficient intensity to cure said polyamic acid or salt thereof in exposed areas, unexposed areas remaining uncured, and
   (b) developing said unexposed areas with a suitable solvent therefor.

6. The process of claim 5, wherein said polyamic acid is selected from the group consisting of benzophenone tetracarboxylic dianhydride/hexane diamine, benzophenone tetracarboxylic dianhydride/oxydianiline, benzophenone tetracarboxylic dianhydride/methylene bis-cyclohexylamine, and pyromellitic dianhydride/oxydianiline.

7. An article comprising a substrate having polyimide image areas thereon, said article having been formed from the process of claim 5.

* * * * *

UNITED STATES PATENT AND TRADEMARK OFFICE
CERTIFICATE OF CORRECTION

PATENT NO. : 4,331,705
DATED : May 25, 1982
INVENTOR(S) : Rama P. Samudrala

It is certified that error appears in the above—identified patent and that said Letters Patent is hereby corrected as shown below:

Title page, under "Filed: Feb. 11, 1980", insert the following paragraph:

--Related U.S. Application Data: Continuation-in-part of Ser. No. 38,060, May 11, 1979, abandoned.--

Column 1, line 4, insert the following paragraph:

--This is a continuation-in-part of application Ser. No. 38,060, filed May 11, 1979, now abandoned.--

Signed and Sealed this

Fifth Day of October 1982

[SEAL]

Attest:

GERALD J. MOSSINGHOFF

Attesting Officer

Commissioner of Patents and Trademarks